(12) United States Patent
Liang

(10) Patent No.: US 11,639,991 B2
(45) Date of Patent: May 2, 2023

(54) PHOTO-DETECTING APPARATUS WITH CURRENT-REUSE

(71) Applicant: Artilux, Inc., Menlo Park, CA (US)

(72) Inventor: Che-Fu Liang, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 403 days.

(21) Appl. No.: 16/904,588

(22) Filed: Jun. 18, 2020

(65) Prior Publication Data
US 2020/0400797 A1 Dec. 24, 2020

Related U.S. Application Data

(60) Provisional application No. 62/863,272, filed on Jun. 19, 2019.

(51) Int. Cl.
*G01S 7/4865* (2020.01)
*G01S 7/4863* (2020.01)

(52) U.S. Cl.
CPC .......... *G01S 7/4865* (2013.01); *G01S 7/4863* (2013.01)

(58) Field of Classification Search
CPC .............................. G01S 7/4863; G01S 7/4865
See application file for complete search history.

(56) References Cited

U.S. PATENT DOCUMENTS

| | | |
|---|---|---|
| 4,789,964 A | 12/1988 | Krilic |
| 7,495,202 B2 | 2/2009 | Schrey |
| 7,629,661 B2 | 12/2009 | Rafferty et al. |
| 7,750,958 B1 | 7/2010 | Dierickx |
| 7,884,310 B2 | 2/2011 | Buettgen |

(Continued)

FOREIGN PATENT DOCUMENTS

| | | |
|---|---|---|
| CN | 1866531 | 11/2006 |
| CN | 101800837 | 8/2010 |

(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

(Continued)

*Primary Examiner* — Thanh Luu
(74) *Attorney, Agent, or Firm* — Fish & Richardson P.C.

(57) ABSTRACT

A photo-detecting apparatus includes a first photodetector, a second photodetector, a first modulation signal generating circuit and a second modulation signal generating circuit. The first is configured to generate at least a first detecting signal according a first modulation signal. The second photodetector is configured to generate a second detecting signal according a second modulation signal. The first modulation signal generating circuit is coupled to the first photodetector and operated between a first voltage and a second voltage, and is configured to generate the first modulation signal. The second modulation signal generating circuit is coupled to the second photodetector and operated between the second voltage and a third voltage. The second modulation signal generating circuit is configured to generate a second modulation signal. The value of the second voltage is between the first voltage and the third voltage.

20 Claims, 5 Drawing Sheets

(56) References Cited

U.S. PATENT DOCUMENTS

| | | | |
|---|---|---|---|
| 8,378,398 | B2 | 2/2013 | Doan et al. |
| 8,405,823 | B2 | 3/2013 | Pfaff |
| 8,860,083 | B1 | 10/2014 | Trezza |
| 9,419,044 | B2 | 8/2016 | Yang et al. |
| 10,418,407 | B2 | 9/2019 | Na et al. |
| 10,707,260 | B2 | 7/2020 | Na et al. |
| 10,861,888 | B2 | 12/2020 | Na et al. |
| 10,964,742 | B2 | 3/2021 | Na et al. |
| 11,448,830 | B2 | 9/2022 | Na et al. |
| 2003/0127672 | A1 | 7/2003 | Rahn et al. |
| 2006/0221452 | A1 | 10/2006 | Chen |
| 2007/0290763 | A1 | 12/2007 | Partridge et al. |
| 2010/0194956 | A1 | 8/2010 | Yuan et al. |
| 2011/0018625 | A1 | 1/2011 | Hodel et al. |
| 2012/0044398 | A1 | 2/2012 | Chou et al. |
| 2012/0181589 | A1 | 7/2012 | Zhu et al. |
| 2013/0119234 | A1 | 5/2013 | Lee et al. |
| 2013/0280879 | A1 | 10/2013 | Stecher et al. |
| 2014/0002700 | A1 | 1/2014 | Oishi |
| 2014/0054736 | A1 | 2/2014 | Meade et al. |
| 2014/0111664 | A1 | 4/2014 | Kumano |
| 2014/0117428 | A1 | 5/2014 | Lee et al. |
| 2014/0312206 | A1 | 10/2014 | Okhonin et al. |
| 2015/0281618 | A1 | 10/2015 | Saito |
| 2016/0150174 | A1 | 5/2016 | Hynecek |
| 2016/0155883 | A1 | 6/2016 | Shi et al. |
| 2016/0316159 | A1 | 10/2016 | Yoneda |
| 2017/0040361 | A1 | 2/2017 | Ikeda et al. |
| 2017/0040362 | A1 | 2/2017 | Na et al. |
| 2017/0068319 | A1 | 3/2017 | Viswanathan |
| 2017/0142362 | A1 | 5/2017 | Liu |
| 2018/0151732 | A1 | 5/2018 | Mehandru et al. |
| 2018/0233521 | A1 | 8/2018 | Na et al. |
| 2018/0233528 | A1 | 8/2018 | Na et al. |
| 2018/0247968 | A1 | 8/2018 | Na |
| 2019/0081095 | A1 | 5/2019 | Hanzawa et al. |
| 2019/0267507 | A1 | 8/2019 | Takeuchi et al. |
| 2019/0348463 | A1 | 11/2019 | Na et al. |
| 2020/0018833 | A1* | 1/2020 | Ding .................... G01S 17/894 |
| 2020/0161364 | A1 | 5/2020 | Na et al. |
| 2020/0192032 | A1 | 6/2020 | Na et al. |
| 2021/0225922 | A1 | 7/2021 | Na et al. |

FOREIGN PATENT DOCUMENTS

| | | |
|---|---|---|
| CN | 108470742 | 8/2010 |
| CN | 101902583 | 12/2010 |
| CN | 103929600 | 7/2014 |
| CN | 102446940 | 10/2014 |
| CN | 104535179 B | 9/2016 |
| CN | 109270547 A | 1/2019 |
| JP | 2002-368205 | 12/2002 |
| JP | 2003-051988 | 2/2003 |
| JP | 2011-066097 | 3/2011 |
| JP | 2012-217059 | 11/2012 |
| TW | 201508938 | 3/2015 |
| TW | 201541624 | 11/2015 |
| TW | 201640663 | 11/2016 |
| WO | WO 2014/192989 | 12/2014 |
| WO | WO 2016/077791 | 5/2016 |
| WO | WO 2016/208215 | 12/2016 |
| WO | WO 2017/015580 | 1/2017 |
| WO | WO 2017/024121 | 2/2017 |
| WO | WO 2017/035447 | 3/2017 |
| WO | WO 2018021126 | 2/2018 |

OTHER PUBLICATIONS

Bandaru et al., "Fabrication and characterization of low temperature (<450° C.) grown p-Ge/n-Si photodetectors for silicon based photonics," Materials Science and Engineering B, 2004, 113:79-84.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron., Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

EP Extended European Search Report in European Application No. 20180845.8, dated Nov. 23, 2020, 7 pages.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Geng, "Structured-light 3D surface imaging: a tutorial," Advances in Optics and Photonics, Jun. 30, 2011, 3(2):128-160.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits, Apr. 2018, 53(4):1071-1078.

Kawahito et al., "A CMOS Time-of-Flight Range Image Sensor With Gates-on-Field-Oxide Structure," IEEE Sensors J., Dec. 2007, 7(12):1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron., Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon., Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Rafferty et al., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Optics Express, Sep. 21, 2015, 23(19):24433-9.

Tseng et al., "A self-assembled microbonded germanium/silicon heterojunction photodiode for 25 Gb/s high-speed optical interconnects," Sci. Rep., Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J., Mar. 2007, 7(3):317-318.

Wu et al., "A critically coupled Germanium photodetector under vertical illumination," Opt. Express, Dec. 31, 2012, 20(28):29338-29346.

(56) References Cited

OTHER PUBLICATIONS

Yin et al., "31GHz Ge n-i-p waveguide photodetectors on Silicon-on-Insulator substrate," Optics Express, Oct. 17, 2007, 15(21):13965-13971.

Yokogawa et al., "IR sensitivity enhancement of CMOS Image Sensor with diffractive light trapping pixels," Sci. Rep., Jun. 19, 2017, 7(1):3832, 9 pages.

* cited by examiner

PHOTO-DETECTING APPARATUS WITH CURRENT-REUSE

CROSS REFERENCE TO RELATED APPLICATION

The present application claims the benefit of the U.S. provisional application No. 62/863,272 filed on Jun. 19, 2019. The contents of the above-mentioned applications are all hereby incorporated by reference.

BACKGROUND OF THE INVENTION

1. Field of the Invention

The present application relates to time of flight (ToF) applications, and more particularly, to a photo-detecting apparatus with current-reusing technique.

2. Description of the Prior Art

In a time of flight (ToF) sensor, photodetectors are the basic device and collectively formed as a pixel array to detect the time of arrival of the reflected light to determine the distance between the TOF sensor and the target object. Typically, all photodetectors of this pixel array are directly coupled to a low-dropout voltage generated by a low-dropout regulator (LDO), where the power consumption under this LDO is determined based on its output voltage and loading. In this sense, when the ToF sensor needs high-resolution pixel array, more photodetectors are required to be added under this LDO, this will be inevitably increasing the overall power consumption.

One approach to reduce the power consumption is to minimize the LDO's output voltage. However, this approach will sacrifice the demodulation contrast (Cd) of the photodetector. In addition, to adjust the power consumption by simply decreasing the DC-DC voltage cannot solve the current spike issue, i.e. the max current spike is still high.

In view of the above, there is a need for an optimized solution to reduce the overall power consumption and lower current spikes of a photodetector.

SUMMARY OF THE INVENTION

An objective of the present application is to reduce the overall power consumption and lower current spikes of a photo detector. The following embodiments of the present application are provided to serve the purpose.

An embodiment of the present application provides a photo-detecting apparatus which comprises a first photodetector, a second photodetector, a first modulation signal generating circuit and a second modulation signal generating circuit. The first photodetector belongs to a first column, and configured to generate at least a first detecting signal according a first modulation signal. The second photodetector is coupled to the first photodetector and belongs to a second column. The second photodetector is configured to generate a second detecting signal according a second modulation signal. The first modulation signal generating circuit is coupled to the first photodetector and operated between a first voltage and a second voltage, and is configured to generate the first modulation signal. The second modulation signal generating circuit is coupled to the second photodetector and operated between the second voltage and a third voltage. The second modulation signal generating circuit is configured to generate a second modulation signal. The value of the second voltage is between the first voltage and the third voltage, and output current of the first photodetector is reused by the second photodetector.

An embodiment of the present application provides a current reuse method that comprises the following steps: providing a first photodetector having a plurality of first input terminals for receiving a plurality of first modulation signals and a plurality of first output terminals for outputting a plurality of first detecting signals; providing a second photodetector having a plurality of second input terminals for receiving a plurality of second modulation signals and a plurality of second output terminals for outputting a plurality of second detecting signals; providing a first modulation signal generating circuit for generating the plurality of first modulation signals; providing a second modulation signal generating circuit for generating the plurality of second modulation signals; and generating a current flowing through the first modulation signal generating circuit, the plurality of first input terminals, the second modulation signal generating circuit and the plurality of second input terminals.

One advantage provided by the present application is that the current-reusing system not only saves power, but also effectively eliminates the current spike problem. Further, the approach and the architecture provided by the present application will not significantly increase the cost, but achieve the goal in an economic way.

These and other objectives of the present invention will no doubt become obvious to those of ordinary skill in the art after reading the following detailed description of the preferred embodiment that is illustrated in the various figures and drawings.

DETAILED DESCRIPTION

Some phrases in the present specification and claims refer to specific elements; however, please note that the manufacturer might use different terms to refer to the same elements. Further, in the present specification and claims, the term "comprising" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Figure 1A:
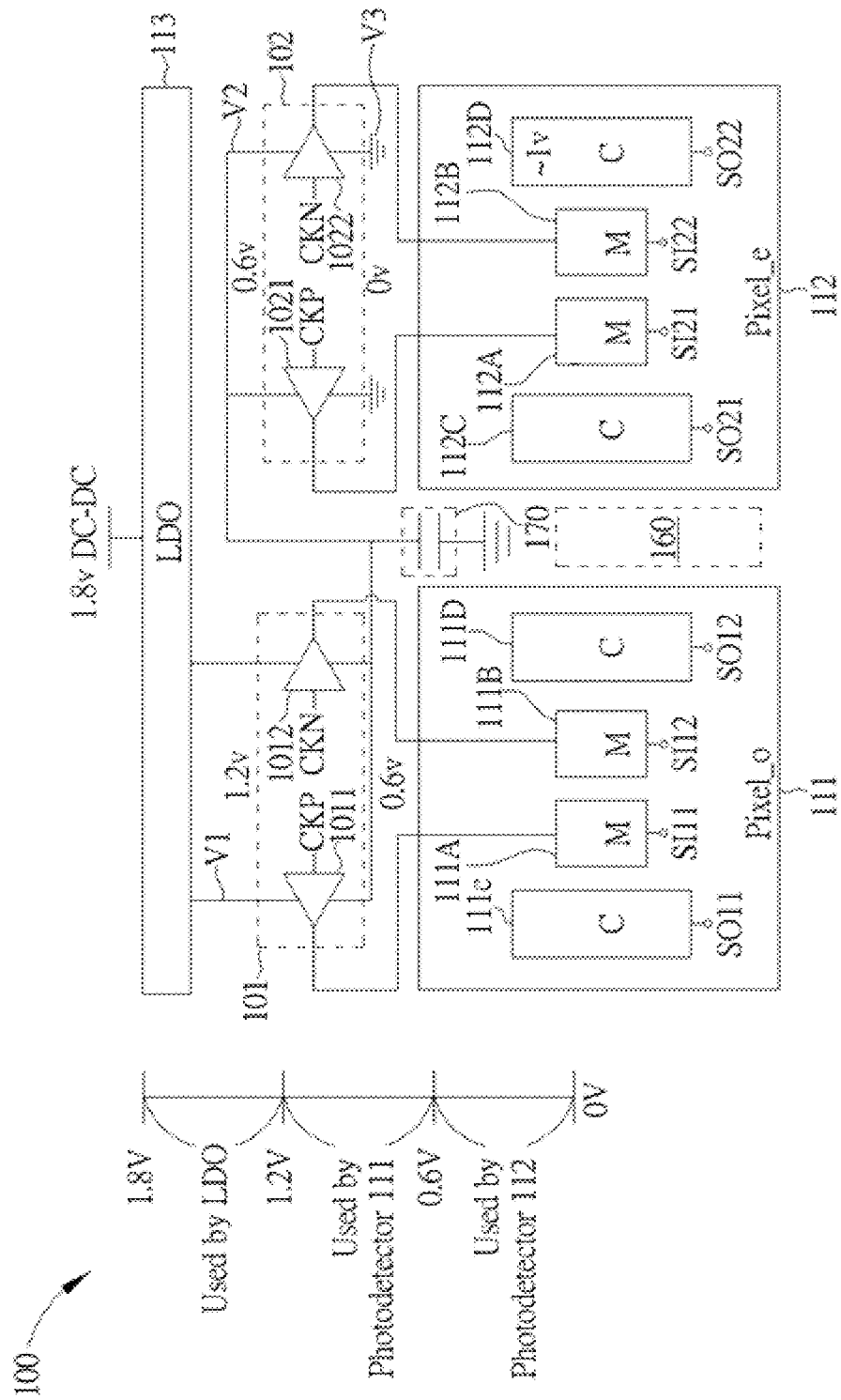
FIG. 1A is a diagram illustrating a photo-detecting apparatus.

Please refer to FIG. 1A, which is a diagram illustrating a photo-detecting apparatus 100. The photo-detecting apparatus 100 comprises a low-dropout regulator (LDO) 113, a first photodetector 111, a second photodetector 112, a first modulation signal generating circuit 101, a second modulation signal generating circuit 102, an isolation unit 160 and a capacitor 170. The LDO 113 is configured to generate a first voltage V1 to bias the first modulation signal generating circuit 101. The second voltage V2 configured to bias the second modulation signal generating circuit 102 can be generated through the first modulation signal generating circuit 101. More specifically, the present application redirects the output current of odd-column pixels (marked with "Pixel_o") to the even-column pixels (marked with "Pixel_e"), to be used by the even-column pixels (e.g., the current outputted by the photodetector 111 can be reused by the photodetector 112.). In this way, the peak of the current can be reduced to half. For example, the range of the operational voltage of the odd-column pixels may be 1.2V-0.6V, and the range of the operational voltage of the even-column pixels may be 0.6V-0V.

Some modifications based on the above concept shall also fall within the scope of the present application. For example, by setting the range of the operational voltage of the even-column pixels to be higher than that of the odd-column pixels, the current outputted from the even-column pixels will be reused by the odd-column pixels. Accordingly, the range of the operational voltage of the even-column pixels may be 1.2V-0.6V, and the range of the operational voltage of the odd-column pixels may be 0.6V-0V.

The isolation unit 160 in this embodiment is used to provide pixel-to-pixel isolation, for preventing the leakage current between the pixels. The isolation unit 160 can be implemented with doping isolation, back-side deep trench isolation (BDTI), or any other alternative to reach the isolating effect.

The first modulation signal generating circuit 101 is configured to generate the modulation signals SI11, SI12 on the input terminals 111A and 111B, wherein the first modulation signal generating circuit 101 is operated under a voltage between the first voltage V1 and the second voltage V2. In this embodiment, the LDO 113 is coupled to a 1.8V DC-DC supply power. A 0.6V mid-power rail can be used for the odd/even pixel drivers. For example, the first voltage V1 may be configured as 1.2V and the second voltage V2 may be configured as 0.6V. In this way, the modulation signals SI11, SI12 can swing between 1.2V and 0.6V.

In another example, the second voltage V2 can be designed to be the middle level of the first voltage V1 and third voltage V3, e.g. V1=1.2V, V2=0.6V and V3=0V, or otherwise the second voltage V2 can be to a voltage level between the first voltage V1 and the third voltage V3 other than the middle value, e.g. V1=1.2V, V2=0.8V and V3=0V, etc.

The second modulation signal generating circuit 102 is configured to generate the modulation signals SI21, SI22 on the input terminals 112A, 112B, wherein the second modulation signal generating circuit 102 is operated between the second voltage V2 and third voltage V3. In this embodiment, the second voltage V2 may be configured as 0.6V and the third voltage V3 may be configured as 0V. In this way, the modulation signals SI21, SI22 can swing between 0.6V and 0V.

The symbol "C" represents a collection region and "M" represents a modulation region. The input terminals 111A and 111B, 112A and 112B are used to receive the modulation signals SI11, SI12, SI21 and SI22. The output terminals 111C, 111D, 112C and 112D are used to collect the photo-generated electron/hole carriers inside the first photodetector 111 and the second photodetector 112, and output the detecting signals SO11, SO12, SO21 and SO22 accordingly. In one example, the input terminals 111A, 111B, 112A and 112B can be doped or un-doped. For example, the input terminals 111A and 111B, 112A, 112B can be doped with N-type or P-type dopants. In one example, the output terminals 111C, 111D, 112C, 112D can be doped. For example, the out terminals 111C, 111D, 112C, 112D can be doped with N-type or P-type dopants.

This embodiment merely shows a two-pixel (2×) stack architecture (e.g., the photo-detecting apparatus 100 stacks two pixels on a current path), but the present application is not limited thereto. That is, a higher degree of pixel (>2×) stack design is possible (e.g., 3× or 4× pixel stack). For example, one may design a four-pixel stack architecture under a 1.2V voltage room, where a first pixel is operated between 1.2V-0.9V, a second pixel is operated between 0.9V-0.6V, and a third pixel is operated between 0.6V-0.3V and forth pixel is operated between 0.3V-0V; and at least a current flows from the first pixel to the forth pixel.

In one example, the first modulation signal generating circuit 101 may comprise the buffer circuits 1011 and 1012, and the second modulation signal generating circuit 102 may comprise the buffer circuits 1021 and 1022. In one example, the buffer circuits 1011, 1012, 1021 and 1022 can be implemented by CMOS inverters. In addition, the MOS transistor used in the buffer circuits 1011, 1012, 1021 and 1022 may be triple-well MOS. For example, the triple-well MOS can be implemented by adding a deep N-well.

The first photodetector 111 is configured to generate the first detecting signals SO11, SO12 on the output terminals 111C, 111D according to the first modulation signals SI11, SI12. The second photodetector 112 is configured to generate the second detecting signals SO21, SO22 on the output terminals 112C, 112D according to the second modulation signals SI21, SI22.

Figure 1B:
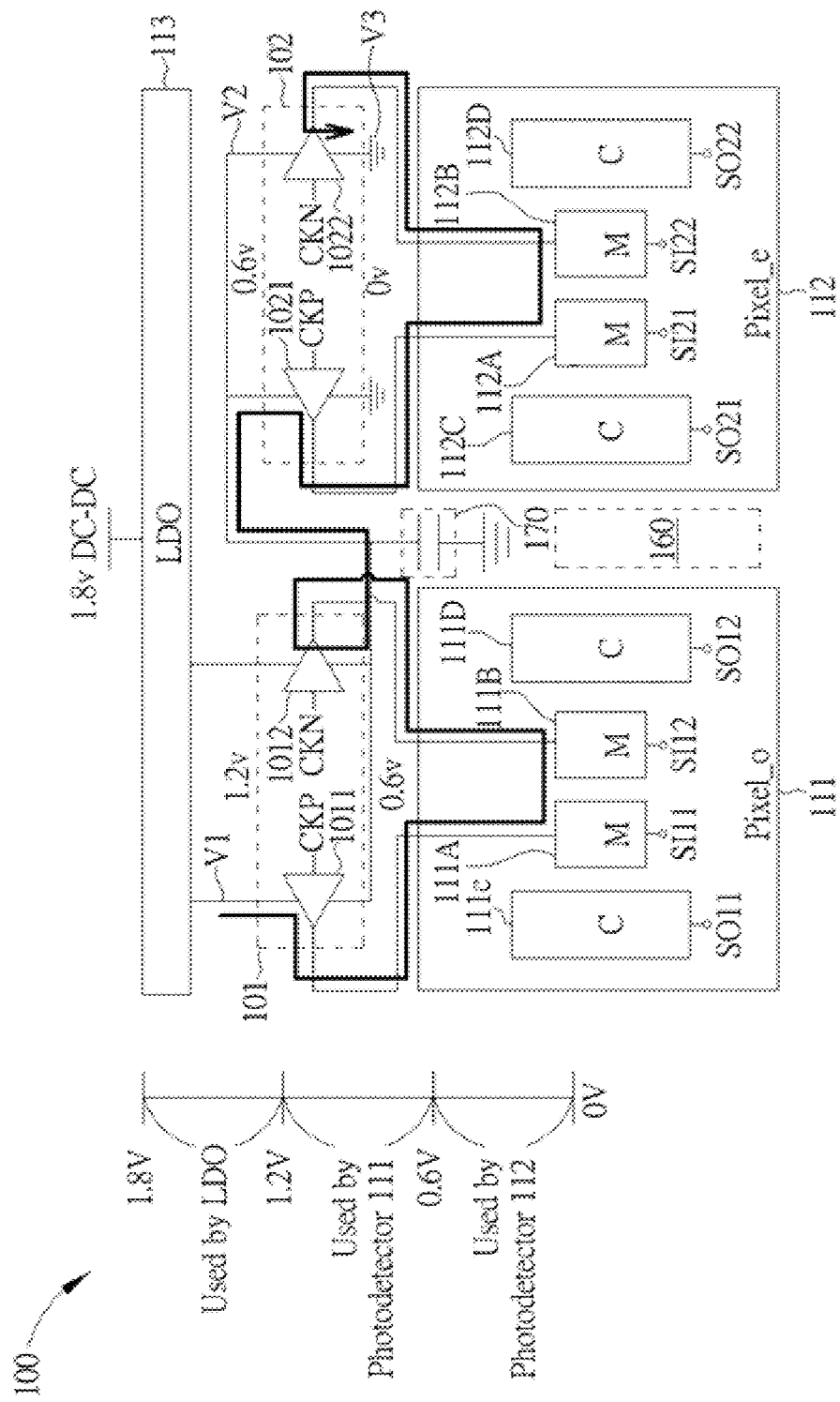
FIG. 1B shows the current path regarding the photo-detecting apparatus of FIG. 1A.

The modulation signals SI11, SI12, SI21 and SI22 can be clock signals with a predetermined duty cycle (e.g., 50% or less than 50%) and can also be sinusoidal signals. For example, the clock signals CKN and CKP may be arranged to control the duty cycle of be 50% or below 50%. During operations, the current generated from the low-dropout regulator LDO will flow through the first modulation signal generating circuit 101, the input terminals 111A, 111B, the second modulation signal generating circuit 102 and the input terminals 111A, 112B. The current path may be indicated by the additional bold line shown in FIG. 1B. With the above configurations, the current flowing through at least two photodetectors 111 and 112 and their respective two modulation signal generating circuits 101 and 102 can be reused.

In addition to above-mentioned elements, the capacitor 170 can be further adopted to reduce the voltage ripple/bouncing of the voltage V2. One terminal of the capacitor 170 is coupled to terminals of the buffer circuits 1011 and 1012, and the other terminal of the capacitor 170 is coupled to ground or a voltage V3.

Figure 2:
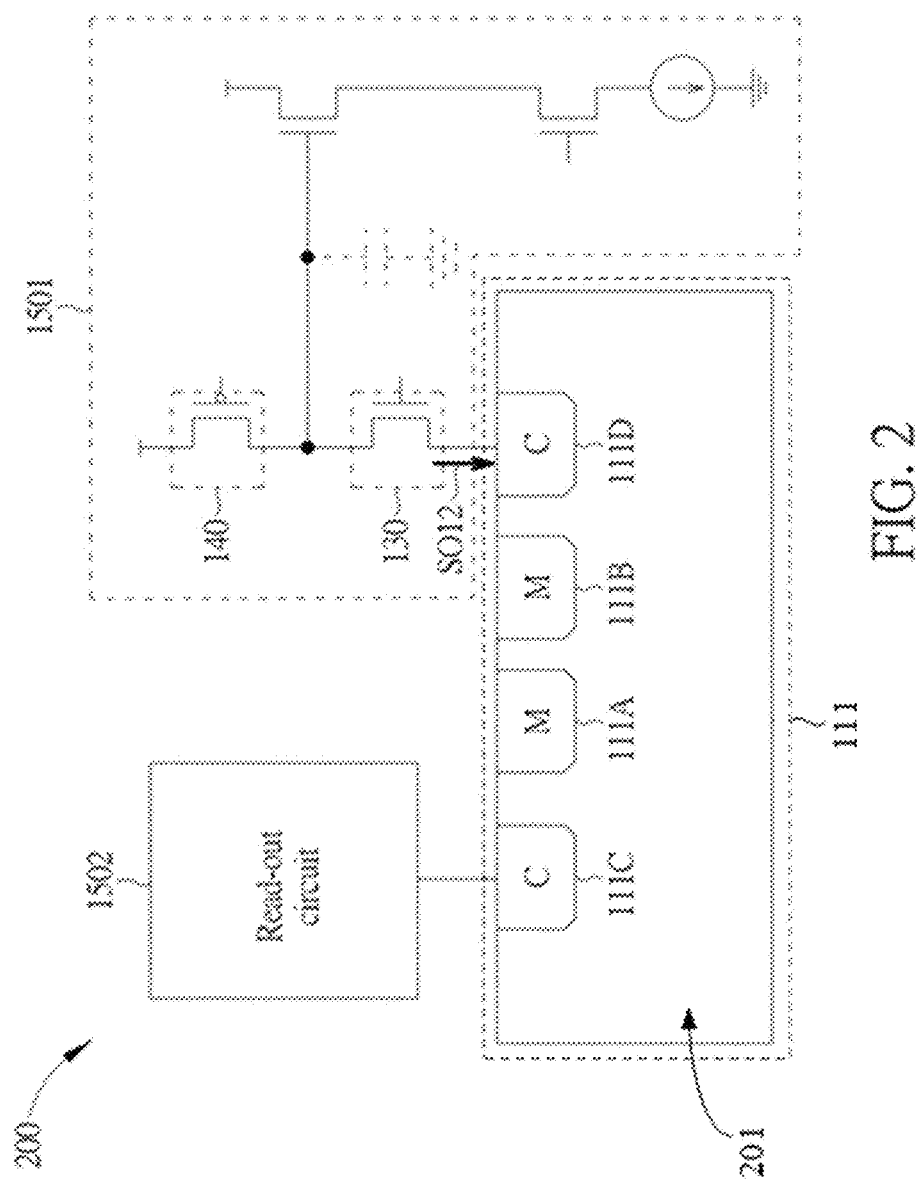
FIG. 2 is a diagram illustrating an architecture including the cross-sectional view of the photodetector accompanied by a read-out circuit and a current buffer transistor according to an embodiment of the present application.

Please refer to FIG. 2, which is a diagram illustrating an architecture 200 including the cross-sectional view of the photodetector 111 accompanied by a read-out circuit 1501 and a read-out circuit 1502 according to an embodiment of the present application. In this embodiment, a current buffer transistor 130 can be added between the reset transistor 140 and the photodetector 111, for connecting/disconnecting the photodetector 111 and the reset transistor 140. The current buffer transistor 130 is able to control the operational voltage of the output terminal 111D. The voltage of output terminal 111D of the first photodetector 111 may be substantially maintained at a constant voltage during operation.

In one example, the output terminals 111C, 111D can be biased at 1.6V and the output terminals 112C, 112D can be biased at 1V. In other words, during operation, the voltages generated at the output terminals 111C, 111D of the photodetector 111 and the voltages generated at the output terminals 112C, 112D of the photodetector 112 can be different. The read-out circuit 1502 is the same or symmetrical with the read-out circuit 1501, the circuit diagram is omitted here for brevity.

According to this embodiment, photodetector 111 uses silicon as a light-absorption material. The input terminals 111A and 111B, and output terminals 112A and 112B can be formed in a silicon region 201 (e.g., silicon substrate). Similarly, the photodetector 112 may also use silicon as a light-absorption material. The input terminals 112A and 112B, and output terminals 112A and 112B can be formed in the silicon region 201 (e.g., silicon substrate). According to some implementations, the silicon region 201 can be replaced with other materials (e.g., III-V semiconductor materials).

Figure 3:
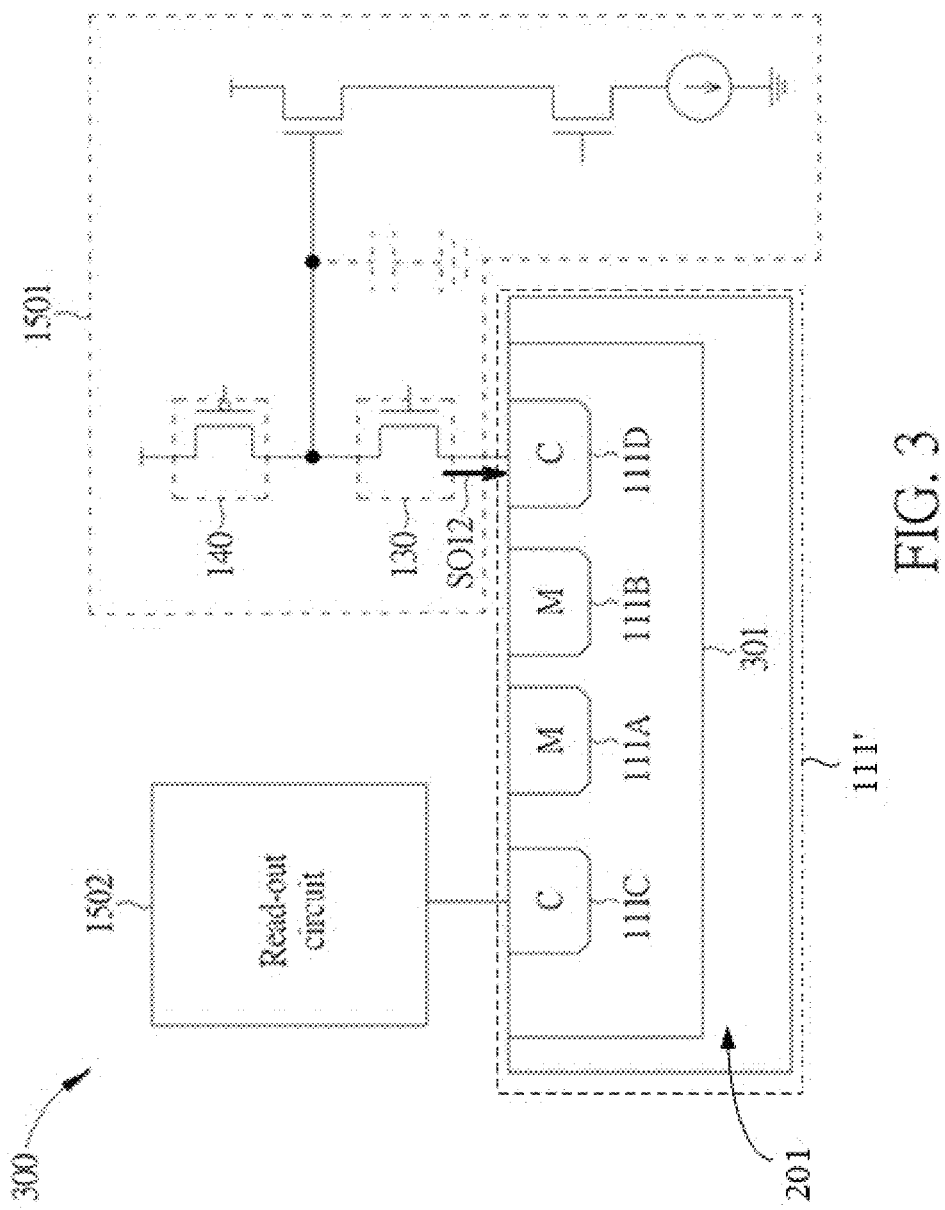
FIG. 3 shows a modification of the architecture of FIG. 2.

FIG. 3 is a diagram illustrating the architecture 300 including the cross-sectional view of the photodetector 111' accompanied by the read-out circuit 1501 and the read-out circuit 1502 according to another embodiment of the present application. In this embodiment, the photodetector 111' uses germanium as a light-absorption material, where the germanium region 301 (which can be viewed as a germanium well) is formed/recessed in the silicon region 201 (e.g., silicon substrate); and the input terminals 111A and 111B, and output terminals 112A and 112B can be formed in a germanium region 301. Similarly, the photodetector 112 may also use germanium as a light-absorption material. The input terminals 112A and 112B, and output terminals 112A and 112B can be formed in another germanium region (not shown in the figure).

According to some implementations, for designing the photodetector 111', the input terminals 111A and 111B can be formed in the germanium region 301 and the output terminals can be formed in the silicon region 201. According to some implementations, the germanium region 201 can be replaced with other materials (e.g., III-V semiconductor materials).

For the architecture 300, the voltages operated at the input terminals 111A, 111B, 112A and 112B and the output terminals 111C, 111D, 112C and 112D can refer the aforementioned embodiments.

Figure 4:
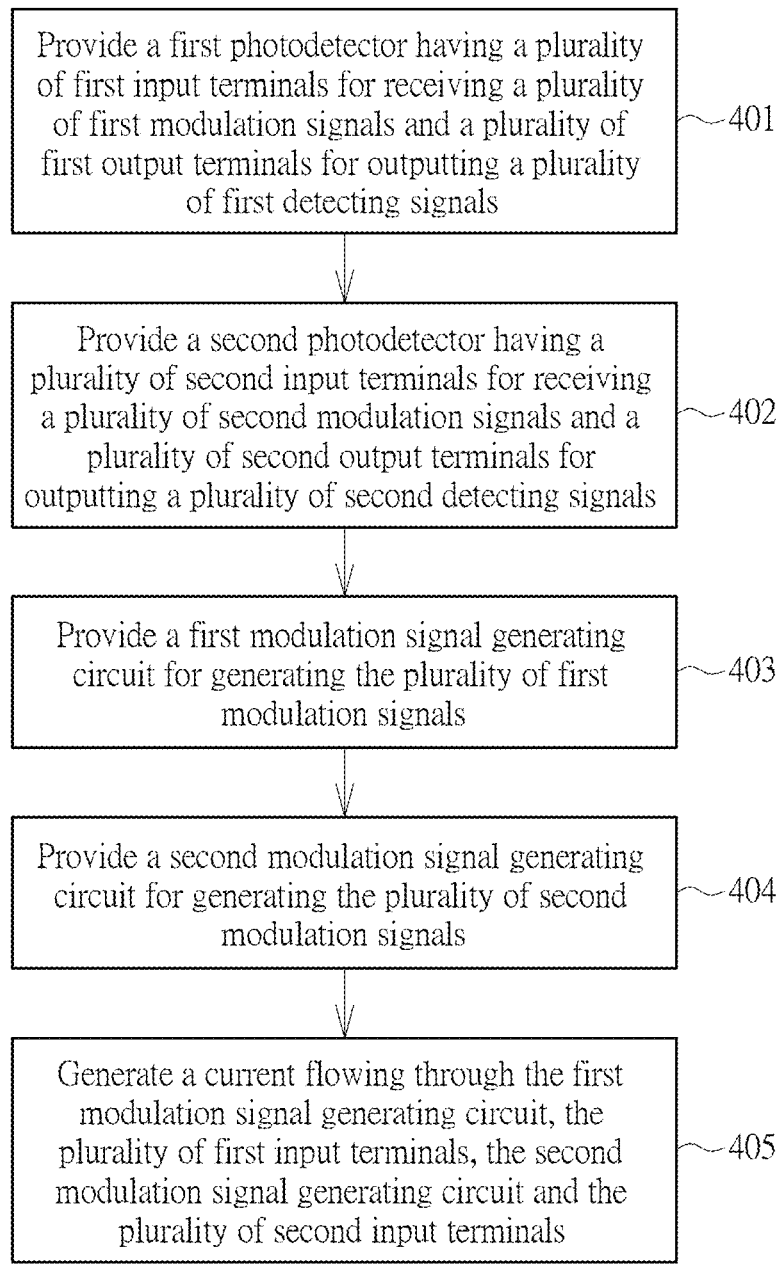
FIG. 4 is a flowchart illustrating a current reuse method for the photo-detecting apparatus according to an embodiment of the present application.

FIG. 4 is a flowchart illustrating a current reuse method for a photo-detecting apparatus according to an embodiment of the present application. The current reuse method in this embodiment includes the following steps:

Step 401: Provide a first photodetector having a plurality of first input terminals for receiving a plurality of first modulation signals and a plurality of first output terminals for outputting a plurality of first detecting signals.

Step 402: Provide a second photodetector having a plurality of second input terminals for receiving a plurality of second modulation signals and a plurality of second output terminals for outputting a plurality of second detecting signals.

Step 403: Provide a first modulation signal generating circuit for generating the plurality of first modulation signals.

Step 404: Provide a second modulation signal generating circuit for generating the plurality of second modulation signals.

Step 405: Generate a current flowing through the first modulation signal generating circuit, the plurality of first input terminals, the second modulation signal generating circuit and the plurality of second input terminals.

More particularity, in some embodiments, the first photodetector is operated between a first voltage and a second voltage; and the second photodetector is operated between the second voltage and a third voltage, where the second voltage is between the first voltage and the third voltage.

In some embodiments, the voltage difference between the first voltage and the second voltage is equal to the voltage difference between the second voltage and the third voltage.

In some embodiments, the first modulation signals and the second modulation signals are clock signals with a predetermined duty cycle (e.g., 50% or less than 50%) and can also be sinusoidal signals.

In some embodiments, the input terminals of the first photodetector and the output terminals of the first photodetector are embedded in a Silicon region (e.g., silicon substrate).

In some embodiments, the input terminals of the first photodetector and the output terminals of the first photodetector are embedded in a germanium region, and the Germanium region is formed on a Silicon region (e.g., silicon substrate).

The current reuse method for a photo-detecting apparatus may have some other embodiments, which can refer to the embodiments disclosed in above photo-detecting apparatus. The repeated descriptions are hereby omitted.

The present application provides an optimized approach which redirects the current outputted from odd-column pixels to even-column pixels. In addition to saving power, the peak current can also be halved if two pixels are stacked. Furthermore, by adopting the proposed solutions, a ToF system with modulation regions and collection regions may have various improvements such as the peak current can be lowered, so that the power/ground routing requirement can be simplified or reduced. Accordingly, overall the chip area can also be reduced. Moreover, under the same available DC-DC supply voltage, the power consumption can be significantly reduced by adopting the apparatus and method of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photo-detecting apparatus, comprising:
   a first photodetector configured to generate at least a first detecting signal according a first modulation signal;
   a second photodetector, coupled to the first photodetector, configured to generate a second detecting signal according a second modulation signal;
   a first modulation signal generating circuit coupled to the first photodetector and operated between a first voltage and a second voltage, configured to generate the first modulation signal; and
   a second modulation signal generating circuit, coupled to the second photodetector and operated between the second voltage and a third voltage, configured to generate a second modulation signal,
   wherein the second voltage is between the first voltage and the third voltage, and
   wherein a current is generated during operation and flows through the first modulation signal generating circuit, the first photodetector, the second modulation signal generating circuit, and the second photodetector.

2. The photo-detecting apparatus of claim 1, wherein the voltage difference between the first voltage and the second voltage is equal to the voltage difference between the second voltage and the third voltage.

3. The photo-detecting apparatus of claim 2, wherein the voltage difference between the first voltage and the second voltage is 0.6V.

4. The photo-detecting apparatus of claim 2, wherein the voltage difference between the first voltage and the second voltage is a value other than 0.6V.

5. The photo-detecting apparatus of claim 1, wherein an isolation unit is arranged between the first photodetector and the second photodetector.

6. The photo-detecting apparatus of claim 1, further comprising a current buffer transistor coupled between an output terminal of the first photodetector and a reset transistor.

7. The photo-detecting apparatus of claim 6, wherein the voltage of output terminal of the first photodetector is substantially maintained at a constant voltage during operation.

8. The photo-detecting apparatus of claim 1, the first modulation signal and the second modulation signal are clock signals with a predetermined duty cycle.

9. The photo-detecting apparatus of claim 8, the duty cycle is less than 50%.

10. The photo-detecting apparatus of claim 8, the first modulation signal and the second modulation signal are sinusoidal signals.

11. The photo-detecting apparatus of claim 1, wherein input terminals of the first photodetector and output terminals of the first photodetector are embedded in a silicon substrate.

12. The photo-detecting apparatus of claim 1, wherein input terminals of the first photodetector and output terminals of the first photodetector are embedded in a germanium region, and the germanium region is formed on a silicon substrate.

13. A current reuse method, comprising:
providing a first photodetector having a plurality of first input terminals for receiving a plurality of first modulation signals and a plurality of first output terminals for outputting a plurality of first detecting signals;
providing a second photodetector having a plurality of second input terminals for receiving a plurality of second modulation signals and a plurality of second output terminals for outputting a plurality of second detecting signals;
providing a first modulation signal generating circuit for generating the plurality of first modulation signals;
providing a second modulation signal generating circuit for generating the plurality of second modulation signals; and
generating a current flowing through the first modulation signal generating circuit, the plurality of first input terminals, the second modulation signal generating circuit and the plurality of second input terminals.

14. The current reuse method of claim 13, wherein the first photodetector is operated between a first voltage and a second voltage; and the second photodetector is operated between the second voltage and a third voltage, where the second voltage is between the first voltage and the third voltage.

15. The current reuse method of claim 13, wherein the voltage difference between the first voltage and the second voltage is equal to the voltage difference between the second voltage and the third voltage.

16. The current reuse method of claim 13, wherein the first modulation signals and the second modulation signals are clock signals with a predetermined duty cycle.

17. The current reuse method of claim 13, wherein the first modulation signals and the second modulation signals are sinusoidal signals.

18. The current reuse method of claim 13, wherein the plurality of first input terminals of the first photodetector and the plurality of first output terminals of the first photodetector are embedded in a silicon substrate.

19. The current reuse method of claim 13, wherein the plurality of first input terminals of the first photodetector and the plurality of first output terminals of the first photodetector are embedded in a germanium region, and the germanium region is formed on a silicon substrate.

20. A photo-detecting apparatus, comprising:
a first photodetector configured to generate at least a first detecting signal according a first modulation signal;
a second photodetector, coupled to the first photodetector, configured to generate a second detecting signal according a second modulation signal;
a first modulation signal generating circuit coupled to the first photodetector and operated between a first voltage and a second voltage, configured to generate the first modulation signal;
a second modulation signal generating circuit, coupled to the second photodetector and operated between the second voltage and a third voltage, configured to generate a second modulation signal, wherein the second voltage is between the first voltage and the third voltage; and
a current buffer transistor coupled between an output terminal of the first photodetector and a reset transistor.

\* \* \* \* \*